United States Patent
Yoho et al.

(10) Patent No.: US 10,686,557 B2
(45) Date of Patent: Jun. 16, 2020

(54) ENHANCED DECODING OF CODED SEQUENCES WITH STRUCTURED DATA

(71) Applicant: L3 Technologies, Inc., New York, NY (US)

(72) Inventors: Brian G. Yoho, Salt Lake City, UT (US); Ryan W. Hinton, Farmington, UT (US); Richard Ross, Sandy, UT (US); Carl Christensen, South Jordan, UT (US)

(73) Assignee: L3 Technologies Inc., New York, NY (US)

( * ) Notice: Subject to any disclaimer, the term of this patent is extended or adjusted under 35 U.S.C. 154(b) by 317 days.

(21) Appl. No.: 15/794,781

(22) Filed: Oct. 26, 2017

(65) Prior Publication Data

US 2019/0132077 A1   May 2, 2019

(51) Int. Cl.
   *H04L 1/00*   (2006.01)
   *H03M 13/29*   (2006.01)
   *H04L 1/08*   (2006.01)
   *H03M 13/41*   (2006.01)

(52) U.S. Cl.
   CPC ........ *H04L 1/006* (2013.01); *H03M 13/2933* (2013.01); *H03M 13/2939* (2013.01); *H03M 13/41* (2013.01); *H04L 1/0045* (2013.01); *H04L 1/0054* (2013.01); *H04L 1/0059* (2013.01); *H04L 1/08* (2013.01)

(58) Field of Classification Search
   CPC ..... H04L 1/006; H04L 1/0059; H04L 1/0054; H04L 1/08; H04L 1/0045; H03M 13/41; H03M 13/2933; H03M 13/2939

USPC .......................................................... 714/755
See application file for complete search history.

(56) References Cited

U.S. PATENT DOCUMENTS

| 6,263,466 | B1* | 7/2001 | Hinedi | H03M 13/2903 |
| | | | | 714/755 |
| 2002/0184590 | A1* | 12/2002 | Ramaswamy | H03M 13/05 |
| | | | | 714/752 |
| 2009/0003459 | A1* | 1/2009 | Limberg | H04L 1/0041 |
| | | | | 375/240.26 |
| 2011/0010608 | A1* | 1/2011 | Kim | H03M 13/2707 |
| | | | | 714/776 |
| 2011/0179334 | A1* | 7/2011 | Kang | H04L 1/0041 |
| | | | | 714/755 |
| 2012/0287855 | A1* | 11/2012 | Kishigami | H04L 1/007 |
| | | | | 370/328 |
| 2015/0106616 | A1* | 4/2015 | Nix | H04L 63/0442 |
| | | | | 713/156 |
| 2016/0164631 | A1* | 6/2016 | Stolitzka | H04L 1/0064 |
| | | | | 714/776 |
| 2016/0233980 | A1* | 8/2016 | Pantelias | H04L 1/0041 |

* cited by examiner

*Primary Examiner* — Albert Decady
*Assistant Examiner* — Enam Ahmed
(74) *Attorney, Agent, or Firm* — Workman Nydegger

(57) ABSTRACT

Methods and systems adapted for providing forward error correction for data packets containing a relationship between the data in each data packet. Data packets encoded in one error correction coding scheme are received and a second error correction coding scheme is identified based on the relationship between the data in each data packet. The data packets are then decoded using the second error correction coding scheme.

26 Claims, 11 Drawing Sheets

ENHANCED DECODING OF CODED SEQUENCES WITH STRUCTURED DATA

BACKGROUND

Background and Relevant Art

Communications systems require reliable data transmission. Reliability is typically improved by increasing the signal power, lowering the data rate, and/or employing error correction coding. Some systems have signal power and data rate requirements that necessitate the use of error correction coding to ensure data integrity. For example, some systems may use forward error correction coding. Forward error correction describes error correction coding techniques which include the capability to correct errors in received data without contacting the transmit side of the system. However, when packet size becomes overly small, error correction coding sometimes fails to ensure sufficiently reliable communication as there may not be sufficient space in the packet to provide robust error correction coding.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

A general system and method framework is provided herein for providing forward error correction of data transmitted through a noisy channel. The method includes receiving data packets encoded in a first error correction coding scheme. Each data packet has data that form a relationship between the data in each data packet. This relationship is used to identify a second error correction coding scheme that is then used to decode the received data packets. In some embodiments, this second error correction coding scheme is agnostic to the first error correction coding scheme. Specific system and method embodiments formed within the general framework are also described.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

In some communications systems, data reliability is reliant on error-correction coding due to limitations on signal power, data rate, and other system requirements. In some applications, ensuring system reliability is further complicated by small packet size. Small packet size can, in some systems, require error correction coding with such a low code rate that the data rate becomes unacceptably low. In other systems, the channel properties may not require coding gain that cannot be supplied for the given packet size.

Typical error correction coding schemes assume that all bits or symbols in a packet are random. However, in practice, packets may contain data that is not random. For example, the data may be related to data in other packets in a data stream in predictable ways. The problem of error correction coding failing to provide reliable transmission in small data packets with data related across multiple packets is solved, in some embodiments, by using relationships between data in the different packets to provide forward error correction independent of, or supplemental to, the error correction coding applied to the transmitted data packets.

The relationship between data bits or symbols across packets provides additional information about the contents of a packet. This additional information is a representation of, or information about, some aspect or contents of the data in a packet that are known, expected, part of a pattern or sequence, or otherwise deduced. In some embodiments, this additional information is exploited to provide forward error correction of the packets. In some embodiments, the forward error correction using the additional information ignores and is agnostic to the error correction coding applied to the packets. In some embodiments, this additional information is used as a supplement to or in concert with the error correction coding applied to the packets. The use of the additional information in these embodiments provides superior forward error correction to that provided by the error correcting code applied to the packets alone. Thus, some embodiments implement an improved computer system that is able to increase communication speeds, reduce transmit power, and/or reduce the amount of error correction coding needed for reliable transmission.

The following discussion now refers to a number of systems, methods, and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 1:
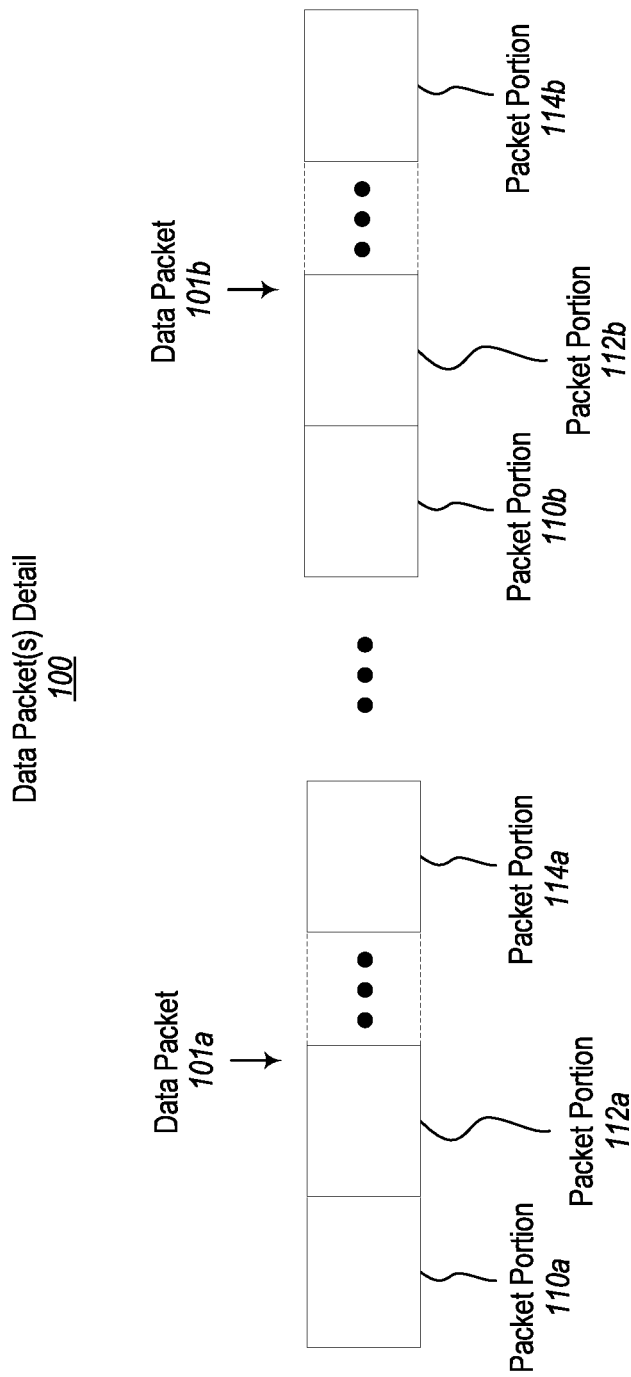
FIG. 1 illustrates example data packets.

Referring now to FIG. 1, data packet(s) detail 100 is shown. Data packet 101a and data packet 101b are typical data packets in a set of data packets. Each data packet 101a and 101b includes packet portions such as packet portion 110a, 112a, 114a, etc., for data packet 101a and packet portion 110b, 112b, 114b, etc., for data packet 101b.

In some embodiments, packet portions 110a, 112a, and 114a are each bits or symbols representing data in the data packet 101a. In some embodiments, packet portions 110a, 112a, and 114a are each groups of bits or symbols. For example, in some embodiments, packet portion 110a, 112a, or 114a is a packet header, a packet number, parity check bits, a data payload, or other information contained within the data packet 101a. In some embodiments, the packet portions 110a, 112a, and 114a are selected as part of an error correction coding scheme.

In some embodiments, the packet portions of each data packet 101a and 101b are divided, grouped, or selected such that each data packet has matching packet portions. For example, in some embodiments, data packet 101a and data packet 101b both contain a packet identifier, such as a number which is contained in packet portion 110a and 110b, respectively. In other embodiments, it will be appreciated that matching packet portions may be distributed differently in each data packet. For example, the packet number is in packet portion 110a of data packet 101a and packet portion 114b of data packet 101b.

Figure 2:
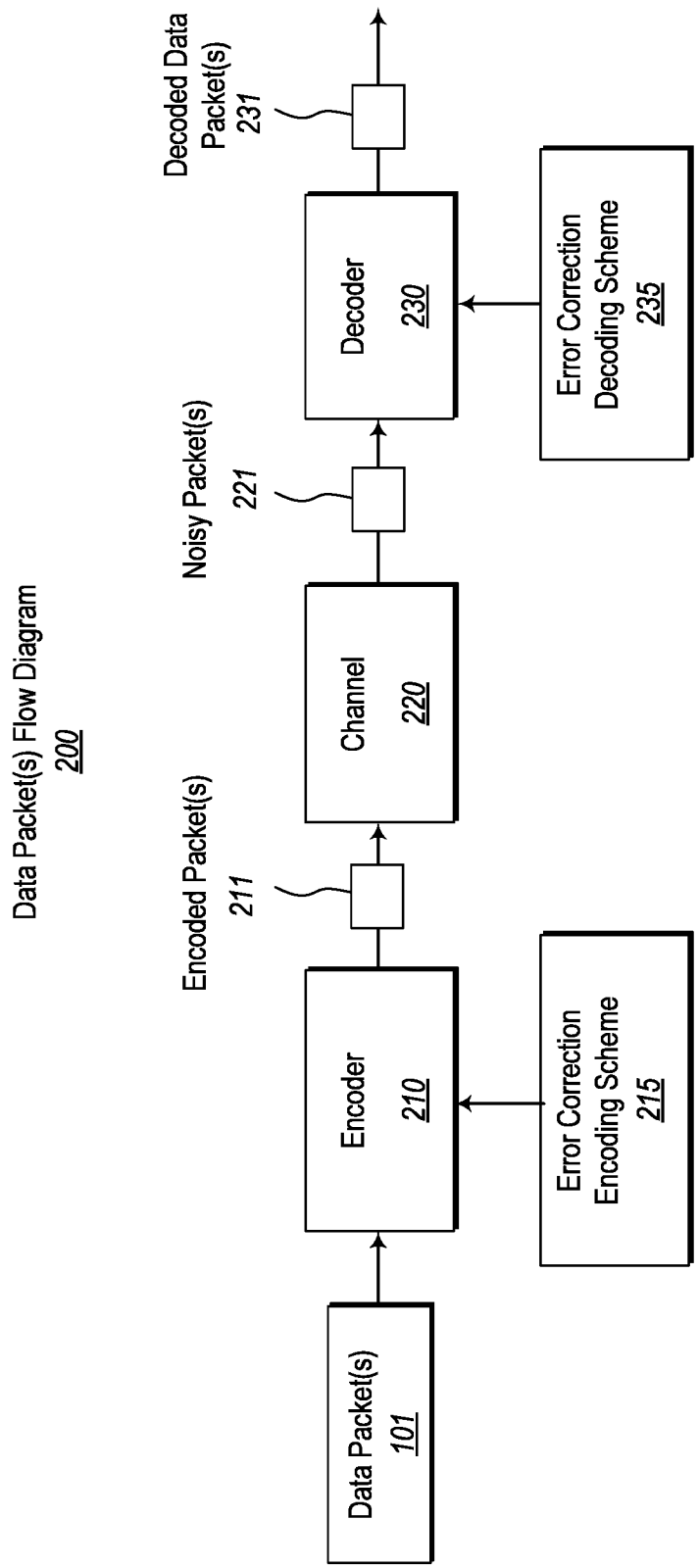
FIG. 2 illustrates a flow diagram of packets through an error correction coding system.

Referring now to FIG. 2, a data packet flow diagram 200 describing data packet flow through a communications system is illustrated. Data packet(s) 101 are presented to an encoder 210 which encodes the data packet(s) 101 using an error correction encoding scheme 215. The encoded packet(s) 211 are sent through a channel 220. The channel 220 is any kind of communications, storage, or other channel for transmitting or otherwise passing the encoded data packet(s) 211 through space and/or time. The channel 220 introduces noise, signal degradation, distortion, or other effects to the encoded packet(s) 211, resulting in noisy packet(s) 221. The noisy packet(s) 221 are received by decoder 230, which uses an error correction decoding scheme 235 to decode the noisy packet(s) 221. In some embodiments, the error correction decoding scheme 235 used by decoder 230 provides forward error correction of the noisy packet(s) 221. The output of the system is the decoded data packet(s) 231.

Note that in some embodiments, the "packet" flow is more complex than that illustrated in FIG. 2. Conceptually, different portions of a packet, and or differ packets may flow through a different elements in a flow. For example, state may be kept from one packet to the next for one portion of packets independent of the other portions. Alternatively or additionally, each portion of a packet may have a totally different FEC scheme. For example, in some embodiments, the data portion of a packet uses a low-density parity check (LDPC) code within the packet concatenated with a repetition code across packets. However, header portions may use two different BCH codes (different number of parity bits), some with distinct, unsynchronized repetition schemes. But each one of these portions can be analyzed with a system similar to that illustrated in FIG. 2.

Note also, the information in one portion can affect the FEC decoding of another portion. For example, in one packet, the sequence number portion (BCH and repetition protected) provides the alignment for the cross-packet repetition coding of the data portion.

In some embodiments, decoder 230 includes elements for receiving data packets. In some embodiments, decoder 230 is part of a receiver system, not illustrated or described herein, which includes elements for receiving data packets. In such embodiments, the decoder 230 receives the noisy packets 221 from the receiver system.

In previous systems, the error correction encoding scheme 215 and the error correction decoding scheme 235 are a matched set. That is, the error correction decoding scheme 235 is aware of and makes use of the encoding provided using the error correction encoding scheme 215. For example, if a certain error correction code is used by the error correction encoding scheme 215, the error correction decoding scheme 235 will use a matching decoder for that error correction code to decode the noisy packet(s) 221.

Embodiments illustrated herein implement systems where the error correction decoding scheme 235 is not necessarily matched to the error correction encoding scheme 215. For example, in some embodiments, the error correction decoding scheme 235 only makes use of a portion of the error correction encoding scheme 215. Alternatively, or additionally, the error correction decoding scheme 235 is agnostic to the error correction encoding scheme 215. Agnostic means that the error correction decoding scheme 235 applies the same methodology for decoding regardless of the exact error correction codes used in the error correction encoding scheme 215. For example, in some embodiments, the error correction decoding scheme 235 does not use the decoder(s) for the error correction code(s) in the error correction encoding scheme 215. In other embodiments, the error correction decoding scheme 235 only needs to know certain parameters of encoder(s) used in the error correction encoding scheme 215 and does not need to know the exact error correction codes which were used. In some embodiments, these certain parameters include code rate, code length, codewords, if the code is a linear code, and if the code is a systematic code.

Figure 3:
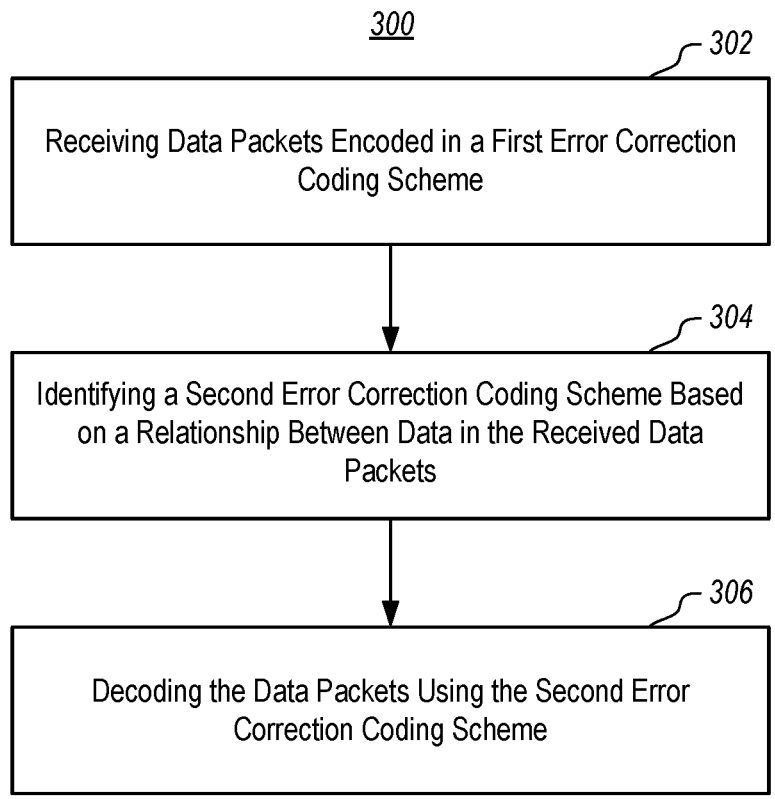
FIG. 3 illustrates a method for providing forward error correction of data packets.

Turning now to FIG. 3, a method 300 is illustrated. The method 300 is a general method structure upon which disclosed methods operate.

Method 300 includes receiving data packets encoded in a first error correction coding scheme (Act 302). In some embodiments, the first error correction coding scheme is error correction encoding scheme 215. In some embodiments, the first error correction coding scheme encodes at least a part of each data packet using a systematic encoder. Those skilled in the art understand that this results in encoded data with two distinct portions. The first portion contains the data message and the second portion contains parity bits. Note that first and second portions as used herein do not denote or require any particular ordering. In particular, a systematic code can have the message bits appear anywhere in the code word: in the beginning, at the end, or even reordered and scattered through the code word. Rather, embodiments are implemented such that the message bits are there, unchanged, and available. Note that most systematic block codes put their message bits together, in order, at the beginning, although this is not required.

In some embodiments, the data packets are the noisy packets 221. In the context of this disclosure, the noisy packets 221 are received by the decoder 230. In this context, in some embodiments, the decoder 230 is considered to have elements for receiving packets from a channel 220. However, FIG. 2 and this description are not intended to limit the disclosed methods and systems. In other embodiments there are receivers, receiver elements, or other hardware that receive the noisy packets 221 from channel 220 and pass them to decoder 230. Some examples are disclosed hereafter.

Regarding the first error correction coding scheme, in some embodiments, encoder 210 will encode each portion of a data packet 101 differently. For example, packet portion 110a is encoded using a first error correction code and packet portion 112a is encoded using a second error correction code. In some embodiments, more than one packet portion may be encoded using the same error correction code. For example, packet portion 110a is encoded using a first error correction code and packet portions 112a and 114a are encoded together by a second error correction code. In some embodiments, the first and second error correction codes are the same. In other embodiments, they are different. In some embodiments, error correction coding scheme 215 contains information or instructions identifying the error correction codes to be used and the packet portions to which each applies.

The method 300 also includes identifying a second error correction coding scheme based on a relationship between data in the received data packets (Act 304). In some embodiments, this second error correction coding scheme is the error correction decoding scheme 235. In other embodiments, it forms only a portion of error correction decoding scheme 235. Typical systems rely on structure provided by error correction encoding and assume that the underlying messages or data are unknown. Method 300 applies to data packets 101 that include a relationship between data in different packets. For systems where a relationship exists between data in the data packets, error correction decoding schemes 235 may be identified based on the relationship.

For example, in some embodiments, the data packets may include packet numbers sent in a sequence. This creates a relationship that each data packet contains a number in a sequence. Knowing this predictable sequence, error correction coding schemes exist to exploit the sequence. In some embodiments, these schemes are agnostic to the first error correction coding schemes used to encode the packets, as described above and discussed below in more detail.

In some embodiments, only a portion of the data packets contains a known relationship. For example, packet portions 110a and 110b may contain data forming a relationship between data packet 101a and data packet 101b. Packet portions 112a and 112b, however, contain data that is essentially unknown, as in previous systems. In some embodiments, the second error correction coding scheme identified only applies to the packet portions with the known relationship. So, in the above example, the error correction encoding scheme would only be identified for packet portions 110a and 110b.

Finally, method 300 includes decoding the data packets using the second error correction coding scheme (Act 306). In some embodiments, the decoder 230 uses the second error correction coding scheme to perform this method act. In some embodiments, the second error correction coding scheme advantageously provides improved forward error correction performance over that offered by decoding of the first error correction coding scheme using an error correction decoding scheme matching or designed to be used with the first error correction coding scheme. In some embodiments, this decoding can be performed with little or no knowledge of the first error correction coding scheme or its corresponding matching error correction decoding scheme. In some embodiments, the decoder(s) of the first error correction coding scheme are not used. In some embodiments, the improvement is a decreased bit-error rate or a lower signal-to-noise ratio (SNR) required for reliable transmission.

In some embodiments the decoder 230 uses the error correction decoding scheme 235 to perform the decoding. In some embodiments, the data packets include first and second portions encoded using first and second error correction codes, respectively, each contained in the first error correction coding scheme. The decoder 230 uses the identified second error correction code in the error correction decoding scheme 235 to decode the first portion of the data packets. The decoder 230 also uses an error correction decoder, also contained in error correction decoding scheme 235, matching or corresponding to the second error correction code from the first error correction coding scheme to decode the second portion of the data packets.

Figure 4:
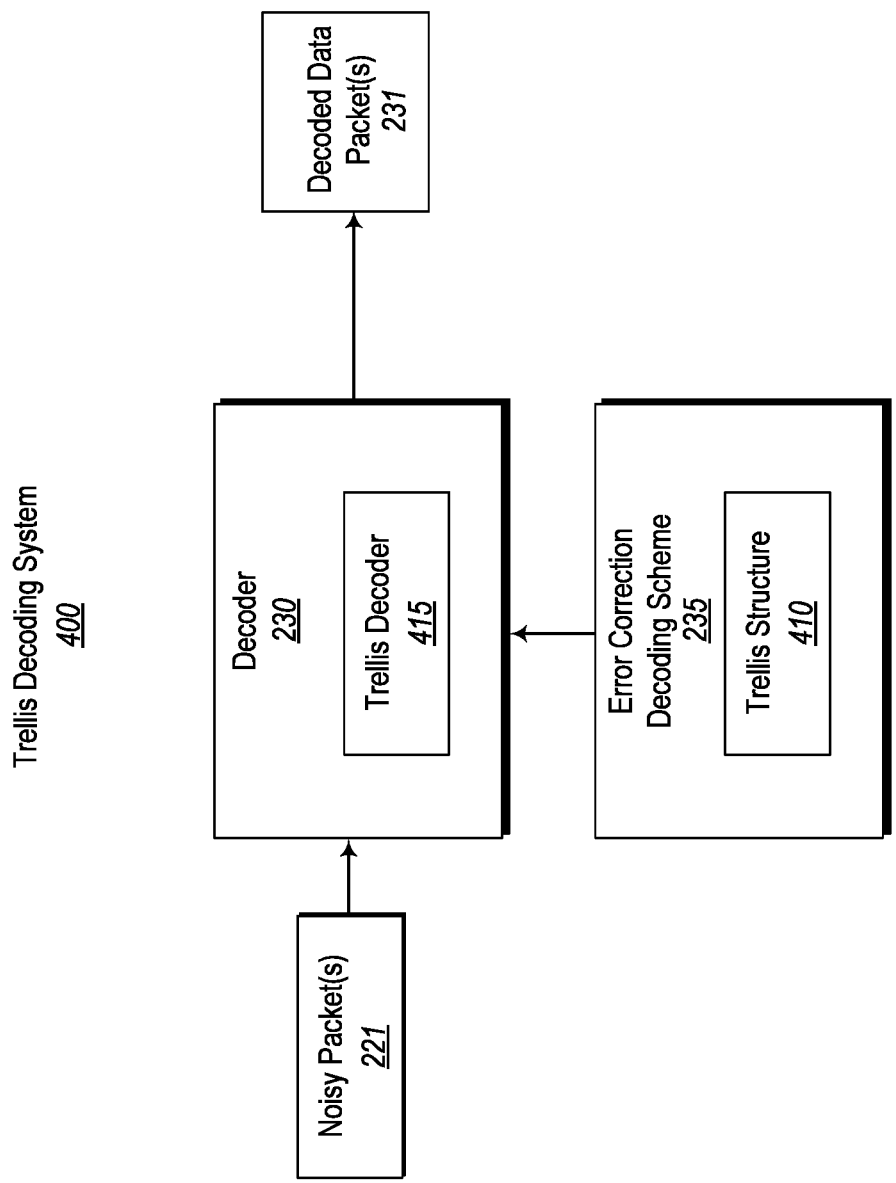
FIG. 4 illustrates a system embodiment for practicing some trellis decoding.

FIG. 4 illustrates a trellis decoding system 400. Trellis decoding system 400 is one embodiment of a system for implementing the method described in method 300. Note that a trellis is used to illustrate the progression of a particular data pattern. However, this is unrelated to trellis coding, trellis modulation, trellis coded modulation, etc. The trellis decoding system includes a decoder 230 and an error correction decoding scheme 235. More specifically, the decoder 230 includes a trellis decoder 415 (such as a Viterbi decoder, or other decoder) and the error correction decoding scheme 235 includes a trellis structure 410. Note that the trellis decoder 415 does not refer to a decoder for trellis coded modulation.

The decoder 230 receives noisy packets 221 and uses trellis decoder 415 to decode the noisy packets 221 into decoded data packets 231. Trellis decoder 415 uses trellis structure 410 as part of the decoding process. The trellis structure 410 is a trellis based on a data feature in the noisy packet(s) 221 that forms a relationship between the noisy packets 221. This relationship between data in the noisy packets 221 is a sequence, repeating value, or some other content in the data packet which has a predictable or known relationship between data packets.

In some embodiments, the trellis structure 410 is based on the entire data packet 101. In some embodiments, the trellis structure 410 is based on the data feature providing the relationship between data in the data packets 101. In some embodiments, the trellis structure 410 is based on a portion of the data feature or the data packet 101, for example, packet portion 110a, 112a, or 114a, as depicted in FIG. 1. In some embodiments, this portion may include part or all of the data feature providing the relationship between data in the data packets 101. In other embodiments, it may include parts of the data packet 101 not included in the data feature providing the relationship between data in the data packets 101.

It should be noted that the relationship between data in the data packets 101 in some embodiments is not a function of the choice of error correction code in the error correction encoding scheme 215. Instead, it is a function of the underlying data in the encoded data packet 211. As such, the trellis decoding system 400 may require in some embodiments that the data feature providing the relationship between data in the data packets 101 be encoded using a systematic encoder.

Trellis decoder 415 is a decoder or algorithm that utilizes the redundancy in data across data packets 101 represented by the trellis structure to recover the data from the noisy packets. In some embodiments, the trellis decoder 415 is a hard-decision decoder. Hard-decision decoders use bit or symbol values in decoding. In some embodiments, the trellis decoder 415 is a soft-decision decoder. Soft-decision decoders use probabilities of bit or symbol values in decoding. In some embodiments, trellis decoder 415 is a Viterbi decoder. In some embodiments, trellis decoder 415 is a soft-decision Viterbi decoder. In some embodiments, trellis decoder 415 is a hard-decision Viterbi decoder. Further details on Viterbi decoders are included below in the description of FIG. 5 describing the trellis structure 410. In some embodiments, the trellis decoder 415 is a Bahl, Cocke, Jelinek, and Raviv (BCJR) decoder. The BCJR decoder is a bit-MAP (maximum a posteriori probability) decoder used for turbo codes.

As discussed above, in some embodiments, the error correction decoding system 235 in the trellis decoding system 400 is agnostic to the error correction encoding system 235 used on the data packets. The trellis decoding system 400 is able to provide decoding using the trellis decoder 415 provided that the redundancy in the data across the data packets is known. In some embodiments, this is accomplished using a systematic encoder for which the message location in the encoded data packets 211 is known. In some embodiments, the code length and/or code rate for the encoder must also be known. However, the decoder for the error correction code used in the error correction encoding scheme 215 need not necessarily be known or used. Within the requirements listed herein, the encoder can be changed at will without impacting the trellis decoding system 400. This allows for changes to the encoder 210 and/or the error correction encoding scheme 215 without affecting the decoder 230 and the error correction decoding scheme 235.

Further, in system embodiments where the data packet size is small, some embodiments of trellis decoding system 400 advantageously provide superior forward error correction over the error correction encoding scheme 215. In some embodiments, superior forward error correction is that trellis decoding system 400 has a smaller bit-error rate than error correction coding scheme 215.

Figure 5:
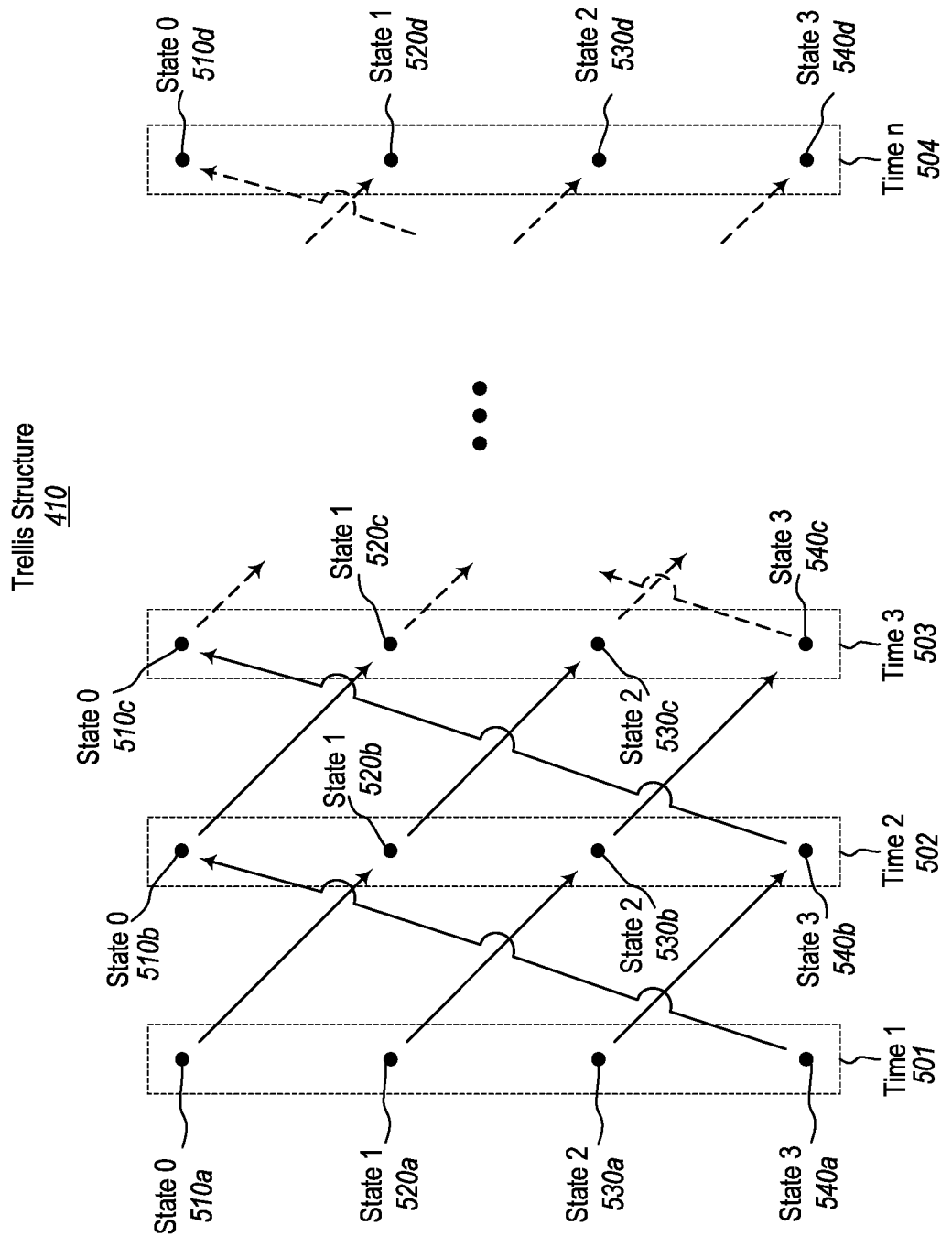
FIG. 5 illustrates a trellis structure.

FIG. 5 illustrates an example trellis structure 410. The example trellis structure 410 has state 0, state 1, state 2, and state 3 for a total of four states. Trellis structures 410 used or described herein may be of any number of states necessary to represent the data on which the trellis structure 410 is based. The trellis structure 410 is depicted as having different times time 1, time 2, time 3, and time n, labeled as 501, 502, 503, and 504, respectively. These times represent arrival times of noisy packets 121. In some embodiments, several consecutive packets may contain the same sequence value and thus be in the same state. For such packets, the state may remain the same for several packets before changing to a new state. In some embodiments, a single packet may contain more than one sequence value, resulting in a single packet transitioning through one or more states of the trellis.

The state values represent some characteristic of the data packets 101 underlying the noisy packet 221. For example, in some embodiments, there is a value contained in the data packets 101 that increments or otherwise has a known relationship between packets. In this embodiment, the trellis state indicates the current value of the counter, and the trellis expresses the constraint that the counter will increment from one time step to the next. In some embodiments, the trellis structure 410 may indicate that the data value progresses through some known cycle of values other than a counting sequence. In some embodiments, the incremental value is a packet number. In other embodiments, the value may be a count number of the number of times specific data payload has been sent. In some embodiments, there are a plurality of values contained in the data that form a relationship between the data packets 101. Those skilled in the art will recognize there are many different characteristics of the header, data payload, or data packet that can be counted, numbered, or otherwise sequentially indicated in a data packet 101.

Continuing with the example trellis in FIG. 5, the trellis structure 410 depicts potential states state 0, state 1, state 2, and state 3 at time 1 501 as 510a, 520a, 530a, and 540a, respectively. A received data packet 101 will be at one of these states. However, the exact state is not known. A received data packet 101 will contain information indicative of the likelihood of the state the data packet 101 is in.

For example, in some embodiments, each of the states represent a packet number that is the same as the state number; e.g. state 0 is a zero, state 1 is a one, etc. An observed data packet 101 at time 1 indicates, for example that each state is equally likely, before any observed data packets. The data in the packet should result in a non-uniform distribution on the states at time 2 and beyond.

FIG. 5 shows that the state 0 further is 510b at time 2, 510c at time 3, and 510d at time n. Likewise, state 1 has 520b, 520c, and 520d, state 2 has 530b, 530c, and 530d, and state 3 has 540b, 540c, and 540d.

The arrows in FIG. 5 indicate state progression. Continuing the example from above, packet number zero at time 1 will progress to packet number one at time 2 and packet number 3 at time 3. When packet number 3 is reached, as in, for example, 540a at time 1, the state wraps back around to state 0, as in the arrow leading to 510b at time 2. In various embodiments, the trellis progression need not only have one possible outcome or progress incrementally. For example, in some embodiments, state 0 is a first value in a sequence and state 1 is a second value in a sequence that follows the first value in the sequence order, but the relationship between the first and second values is contained within the sequence. In other embodiments, the state 0 connects to state 1 and state 0. This provides more paths through the trellis structure 410. Those skilled in the art understand the various embodiments of trellis structures for representing state transitions and the like. Those skilled in the art will understand that using or forming a trellis need not include generating or creating a trellis structure 410 as shown in FIG. 5, but that this is simply a graphical aid for interpreting the trellis structure 410 used in the trellis decoder 415.

Continuing the example, the data packet 101 at time 2 is the next data packet and observation of this data packet will indicate potential state data as well. For example, the data packet 101 received at time 2 may indicate that states 2 and 3 are each equally likely, but states 0 and 1 are excluded or not possible. While these numbers are only for an example, one skilled in the art will appreciate that this indicates that the packet at time 1 could not have been at state 3 or state 0, as the succeeding states 0 and 1 are not possible at time 2. This reduces the number of states that need to be considered. For example, when a third data packet 101 arrives at time 3, it may indicate that again, states 2 and 3 are each equally likely and states 0 and 1 are excluded or not possible. The only remaining path through the trellis structure is that the data packet at time 1 was in state 1 520a, the data packet at time 2 was in state 2 530b, and the data packet at time 3 was in state 3 540c.

This example is somewhat simplistic, but those skilled in the art recognize that there are a number of algorithms that have been developed for selecting an optimal path through a trellis structure based on observations of the data. One embodiment of such an algorithm is the Viterbi algorithm. This algorithm tracks a metric for each state at each time. The metric naturally eliminates paths that are unlikely and ultimately converges to the most likely path for a set of observations and recursively updates as new data is received. In the above example, the metric is the probability of being in each state and the set of observations are the three data packets.

Viterbi algorithms are well known in the art, including variations for decoding error correction codes, which are usually referred to as Viterbi decoders. They can operate on trellis structures where states are represented by one bit, several bits, or symbols. The trellis structure 410 in FIG. 5 is representative of trellis structures that can be decoded or solved by a Viterbi decoder or other trellis decoders. Those skilled in the art will recognize that various embodiments of the Viterbi decoder or algorithm can be used to identify an optimal path through the trellis structure 410.

Figure 6:
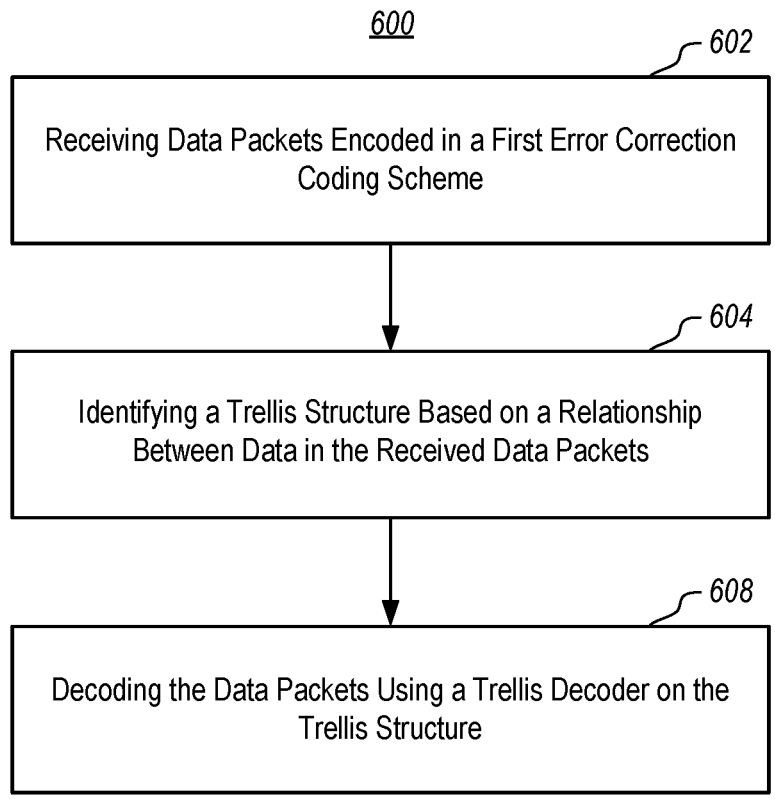
FIG. 6 illustrates a method for providing forward error correction of data packets using a trellis structure.

FIG. 6 illustrates a method 600 for performing decoding of data packets. The method 600 is one embodiment analogous or similar to method 300 and is an embodiment of methods for using or decoding with trellis decoding system 400.

Method 600 includes receiving data packets encoded in a first error correction coding scheme (Act 602). Like method 300, in some embodiments, the first error correction coding scheme is error correction encoding scheme 215. In some embodiments, the first error correction coding scheme encodes at least a part of each data packet using a systematic encoder. In some embodiments, the data packets are the noisy packets 221.

The method 600 also includes identifying a trellis structure based on a relationship between data in the received data packets (Act 604). Method 600 applies to data packets 101 that include a relationship between payload data in different packets. For systems where a relationship exists between data in the data packets, a trellis structure may be identified based on the relationship between data in the data packets. In some embodiments, identifying the trellis structure is only performed once. In some embodiments, identifying the trellis structure occurs before the data packets 101 are sent.

Identifying a trellis structure determines certain aspects of the trellis decoder, such as the number of states and the amount of storage required. Act 604 is analogous to act 304 of method 300, identifying a second error correction decoding scheme. The second error correction coding scheme in embodiments of the trellis decoding system is the trellis decoder 415 and corresponding trellis structure 410.

Method 600 further includes decoding the data packets using a trellis decoder on the trellis structure (Act 606). In some embodiments, the decoder 230 uses the error correction decoding scheme 235 to perform this method act. In some embodiments, the error correction coding scheme 235 advantageously provides improved forward error correction performance over that offered by decoding of the first error correction coding scheme using an error correction decoding scheme matching or designed to be used with the first error correction coding scheme. In some embodiments, this decoding can be performed with little or no knowledge of the first error correction coding scheme or its corresponding matching error correction decoding scheme. In some embodiments, the decoder(s) of the first error correction coding scheme are not used. In some embodiments, the improvement is a decreased bit-error rate or a lower signal-to-noise ratio (SNR) required for reliable transmission.

In some embodiments the decoder 230 uses the error correction decoding scheme 235 to perform the decoding. In some embodiments, the data packets include first and second data portions encoded using first and second error correction codes, respectively, each contained in the first error correction coding scheme. The decoder 230 uses the trellis decoder 415 to decode the first data portion of the data packets. The decoder 230 also uses an error correction decoder, contained in error correction decoding scheme 235, matching or corresponding to the second error correction code from the first error correction coding scheme to decode the second data portion of the data packets. In some embodiments, the decoder 230 uses the trellis decoder 415 to decode the first data portion of the data packets; the decoder 230 also uses an error correction decoder, contained in error correction decoding scheme 235, matching or corresponding to the second error correction code from the first error correction coding scheme also to decode the first data portion of the data packets to improve performance.

Figure 7:
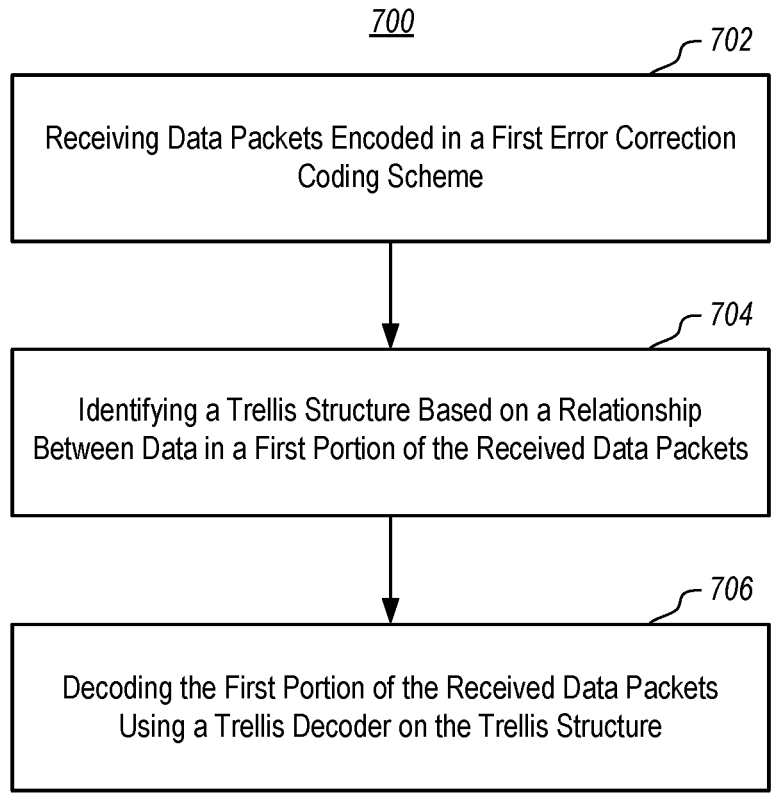
FIG. 7 illustrates a method for providing forward error correction of a portion of data packets using a trellis structure.

FIG. 7 illustrates a method 700 for performing decoding of data packets. The method 700 is another embodiment analogous or similar to method 300 and is an embodiment of methods for using or decoding with trellis decoding system 400.

Like method 600, method 700 includes receiving data packets encoded in a first error correction coding scheme (Act 702). In some embodiments, the first error correction coding scheme is error correction encoding scheme 215. In some embodiments, the first error correction coding scheme encodes at least a part of each data packet using a systematic encoder. In some embodiments, the data packets are the noisy packets 221.

Regarding the first error correction coding scheme, in some embodiments, encoder 210 will encode each portion of a data packet 101 differently. For example, packet portion 110a is encoded using a first error correction code and packet portion 112a is encoded using a second error correction code. In some embodiments, more than one packet portion may be encoded using the same error correction code. For example, packet portion 110a is encoded using a first error correction code and packet portions 112a and 114a are encoded together by a second error correction code. In some embodiments, the first and second error correction codes are the same. In other embodiments, they are different. In some embodiments, error correction coding scheme 215 contains information or instructions identifying the error correction codes to be used and the packet portions to which each applies. In some embodiments, there is more than one (physical or logical) encoder for the different data portions.

The method 700 also includes identifying a trellis structure based on a relationship between data in a first portion of the received data packets (Act 704). Method 700 applies to data packets 101 that include a relationship between portions of data in different packets. For systems where a relationship exists between data in the data packets, a trellis structure may be identified based on the relationship between data in the data packets. In some embodiments, identifying the trellis structure is only performed once. In some embodiments, identifying the trellis structure occurs before the data packets 101 are sent.

In some embodiments, the first portion is packet portion 110a, 112a, or 114a of data packet 101a. In some embodiments, the first portion is two or more of packet portions 110a, 112a, or 114a of data packet 101a. In some embodiments, the first portion is the message portion of a systematically encoded message. Note that in some embodiments, the first portion does not need to be encoded. It can be treated as being encoded as part of an uncoded data stream that is a systematic rate-1 code. One could envision an 'encoder' that takes in uncoded data and outputs the same uncoded data back out.

Identifying a trellis structure determines certain aspects of the trellis decoder, such as the number of states and the amount of storage required. As such, act 704 corresponds to 304 of method 300, identifying a second error correction decoding scheme. The second error correction coding scheme in embodiments of the trellis decoding system is the trellis decoder 415 and corresponding trellis structure 410.

Finally, method 700 includes decoding the first portion of the received data packets using a trellis decoder on the trellis structure (Act 706). In some embodiments, the decoder 230 uses the error correction decoding scheme 235 to perform this method act. In some embodiments, the error correction coding scheme 235 advantageously provides improved forward error correction performance over that offered by decoding of the first error correction coding scheme using an error correction decoding scheme matching or designed to be used with the first error correction coding scheme. In some embodiments, this decoding can be performed with little or no knowledge of the first error correction coding scheme or its corresponding matching error correction decoding scheme. In some embodiments, the decoder(s) of the first error correction coding scheme are not used. In some embodiments, the improvement is a decreased bit-error rate or a lower signal-to-noise ratio (SNR) required for reliable transmission.

In some embodiments the decoder 230 uses the error correction decoding scheme 235 to perform the decoding. In some embodiments, the data packets include first and second data portions encoded using first and second error correction codes, respectively, each contained in the first error correction coding scheme. The decoder 230 uses the trellis decoder 415 to decode the first portion of the first data portion of the data packets. The decoder 230 also uses an error correction decoder, contained in error correction decoding scheme 235, matching or corresponding to the second error correction code from the first error correction coding scheme to decode the second data portion of the data packets.

Figure 8:
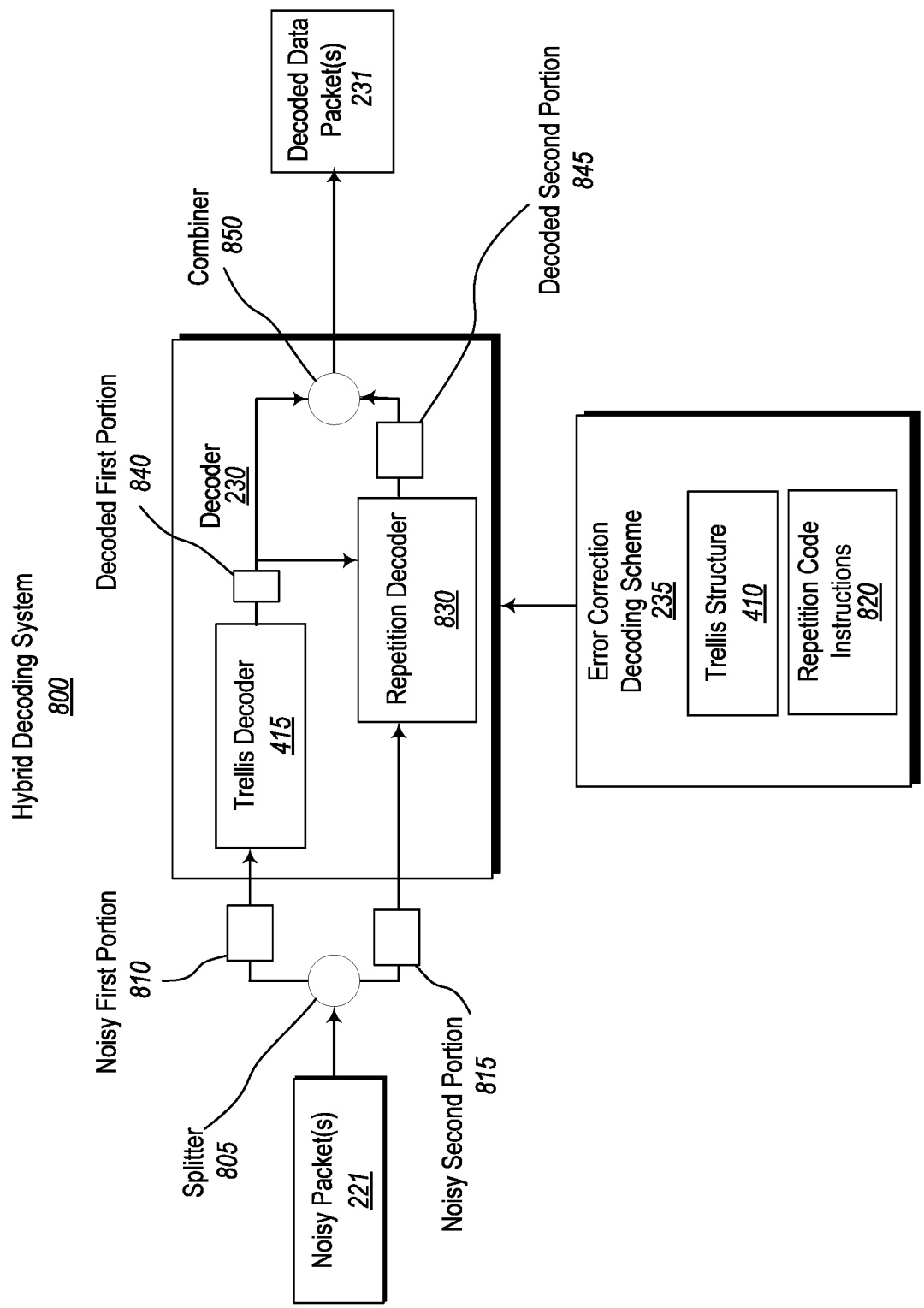
FIG. 8 illustrates a system embodiment for practicing hybrid decoding.

FIG. 8 illustrates a hybrid decoding system 800. Trellis decoding system 800 is another embodiment of a system for implementing the method described in method 300.

The hybrid decoding system 800 includes decoder 230 and error correction decoding scheme 235. Decoder 230 includes trellis decoder 415 and repetition decoder 830. In some embodiments, decoder 230 also includes a splitter 805 and/or a combiner 850. In some embodiments, splitter 805 and/or combiner 850 are separate from decoder 230. Error correction decoding scheme 235 includes trellis structure 410 and repetition code instructions 820.

In hybrid decoding system 800, noisy packets 221 are split by a splitter 805 into a noisy first portion 810 and a noisy second portion 815. The noisy first portion 810 and noisy second portion 815 are selected from the noisy packets 221 such that they contain the data which provides a relationship between the data packets 101. In some embodiments of this system, the noisy first portion 810 is the least significant bits of the numbers or symbols contained in the data, while the noisy second portion 815 is the most significant bits. The data providing the relationship between data packets 101 in embodiments of the hybrid decoding system 800 is a number or value in an incremental sequence. When the sequence reaches the maximum value, it repeats. As such, the noisy first portion 810 will count through the least significant bits portion of the sequence, while noisy second portion 815 remains the same. Once the sequence has reached a point where bits or symbols in noisy second portion 815 change, noisy first portion 810 will repeat the same set of values. In other words, for a complete sequence of noisy first portion 810, a correct decoding of noisy second portion 815 should be a constant value. This creates a relationship where, for each cycle through a trellis representing noisy first portion 810, noisy second portion 815 can be considered a repetition code.

For example, in one embodiment, the data in the sequence are eight bits which count from 0 to 255 and then repeat. In some embodiments, this counting represents groups of packet numbers. Noisy first portion 810 is the four least significant bits and noisy second portion 815 is the four most significant bits of the values in the sequence. For the first sixteen values in the sequence (0 to 15), the noisy first portion 810 will count from 0 to 15. Noisy second portion 815 will be all zeros for this group. For the next sixteen values, noisy first portion 510 will again count from 0 to 15, but noisy second portion 815 will be a 1 and three 0s. For each successive group of sixteen values of noisy first portion 810, noisy second portion 815 will have a single value. This value can be used as a repetition code across each group of sixteen values in the noisy first portion 810.

Returning to FIG. 8, noisy first portion 810 is presented to decoder 230, which decodes noisy first portion 810 into decoder first portion 840 using trellis decoder 415. Trellis decoder 415 makes use of trellis structure 410 in error correction decoding scheme 235. This portion of the hybrid decoding system 800 is essentially the same as the corresponding portions of trellis decoding system 400 shown in FIG. 4, except that it is only applied to the noisy first portion 810 of the noisy packet(s) 121.

Trellis decoder 415 is a decoder or algorithm that decodes the trellis structure 415 based on the relationship between data in the data packets 101. In some embodiments, the trellis decoder 415 is a hard-decision decoder. Hard-decision decoders use bit or symbol values in decoding. In some embodiments, the trellis decoder 415 is a soft-decision decoder. Soft-decision decoders use probabilities of bit or symbol values in decoding. In some embodiments, trellis decoder 415 is a Viterbi decoder. In some embodiments, trellis decoder 415 is a soft-decision Viterbi decoder. In some embodiments, trellis decoder 415 is a hard-decision Viterbi decoder.

Noisy second portion 815 is presented at repetition decoder 830, which decodes noisy second portion 815 into decoded second portion 845 using the decoded first portion 840 and repetition code instructions 820 in error correction decoding scheme 235. In some embodiments, the decoding of noisy second portion 815 makes use of the decoded first portion 840 to determine the groupings for the repetition code used by repetition decoder 830.

Decoded first portion 840 and decoded second portion 845 are then combined by combiner 850 into decoded data packet 231.

Similar to trellis decoding system 400, in some embodiments, hybrid decoding system 800 is agnostic to the error correction encoding system 235 used on the data packets. The hybrid decoding system 800 is able to provide decoding using the trellis decoder 415 and repetition decoder 830 provided that the codeword structure is such that proper noisy first and second portions 810 and 815 can be identified. In some embodiments, this requires that a systematic encoder be used in the first error correction coding scheme. And that the message location in the encoded data packets 211 be known. In some embodiments, the code length and/or code rate for the encoder must also be known. However, the decoder for the error correction code used in the error correction encoding scheme 215 need not be known or used. Within the requirements listed herein, the encoder can be changed at will without impacting hybrid decoding system 800. This advantageously allows for changes to the encoder 210 and/or the error correction encoding scheme 215 without affecting the decoder 230 and the error correction decoding scheme 235.

Further, in systems or embodiments where the data packet size is small, some embodiments of hybrid decoding system 800 advantageously provides superior forward error correction over the error correction encoding scheme 215. In some embodiments, superior forward error correction is that hybrid decoding system 800 has a smaller bit-error rate than error correction coding scheme 215.

Additionally, in some embodiments, hybrid decoding system 800 provides improvements in implementation efficiency over embodiments of trellis decoding system 400, including reduced storage requirements. For example, in some embodiments of trellis decoding system 400, the trellis represents sequence values, as in the eight-bit example provided above. This requires 256 states in the trellis. By splitting the bits into groups, hybrid decoding system 800 naturally requires fewer states in the trellis structure 410.

For example, if the noisy first portion is four bits, the trellis structure 410 in hybrid decoding system 800 only requires sixteen states instead of the 256 required for trellis decoding system 400. In systems where sequence values use 10, 15, or more bits, the trellis structure 410 of trellis decoding system 400 requires potentially thousands of states. This can be difficult or even impossible to store or implement. Hybrid decoding system 800 advantageously allows selection of the trellis size independent of the number of bits or symbols in the sequence values. The system can be implemented with a chosen, efficient size of trellis structure 410. The repetition code instructions 820 for repetition decoder 830 need only be modified to account for the extra bits or symbols in the repetition code, which is much less costly than the extra trellis states.

Figure 9:
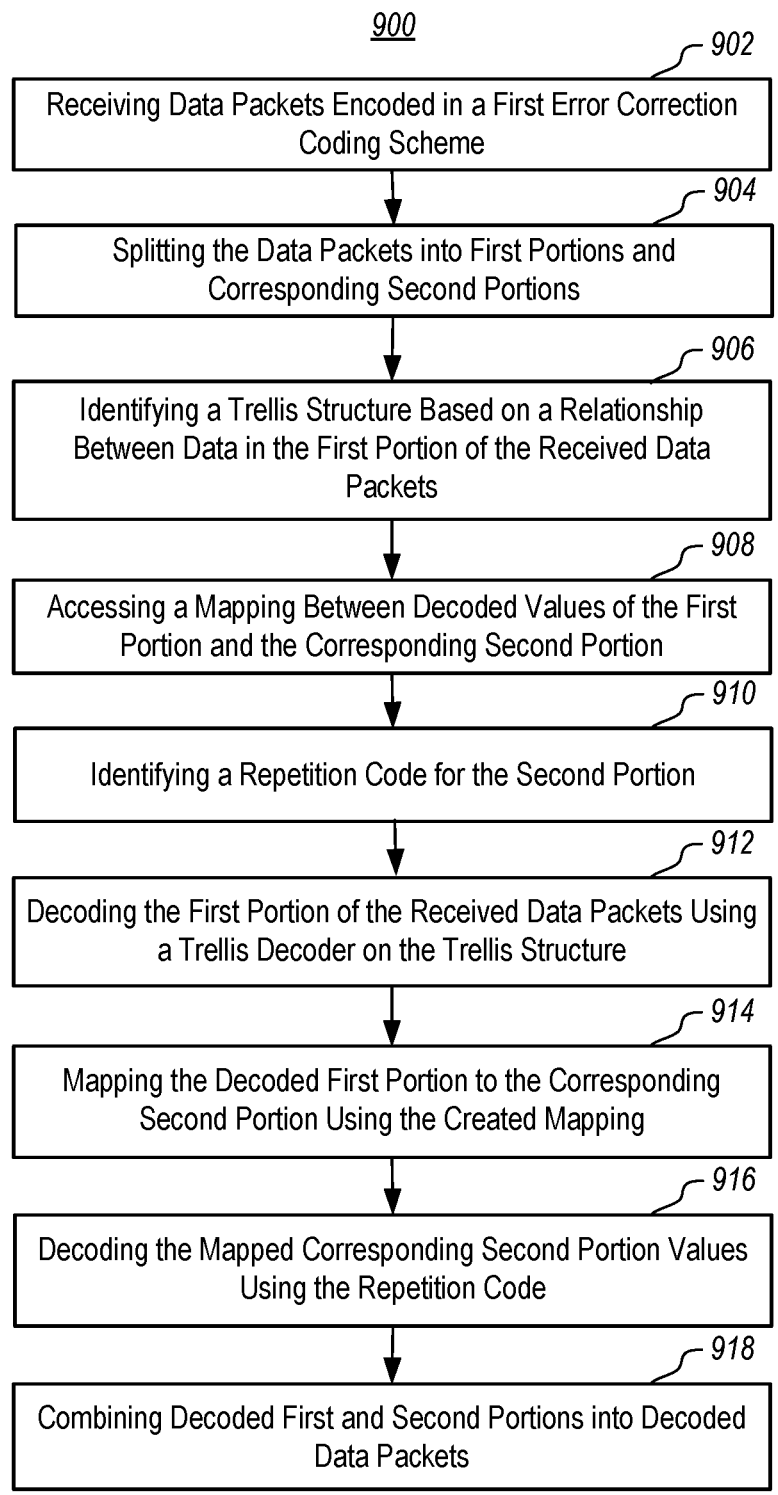
FIG. 9 illustrates a method for providing forward error correction of data packets using a trellis and repetition code.

FIG. 9 illustrates a method 900 for performing decoding of data packets. The method 900 is analogous or similar to method 300 and is an embodiment of methods for using or decoding with hybrid decoding system 800.

Method 900 includes receiving data packets encoded in a first error correction coding scheme (Act 902). Act 902 is the analogous to Act 302 in method 300.

The method 900 further includes splitting the data packets into first portions and corresponding second portions (Act 904). In some embodiments, the first portions and second portions are taken from only a portion of each data packet 101. In some embodiments, the first portions and second portions are taken from the message portion of a systematically encoded message. The first and second portions are the noisy first portion 810 and the noisy second portion 815.

The method 900 includes identifying a trellis structure based on a relationship between data in the first portion of the received data packets (Act 906). Act 906 is similar to act 604 or act 704, except that it is performed only for the data in the first portion of the received data packets.

As described above with regards to the hybrid decoding system 800, there is a relationship between the first and second portions of the data packets. Method 900 also includes accessing a mapping between decoded values of the first portion and the corresponding second portion (Act 908). In some embodiments, this is a relationship between the first portion and second portion of the data packets 101. In some embodiments, this relationship is that the first portion is least significant bits of a value or number in a sequence and the second portion is the most significant bits. In such embodiments, the partition between the first and second portions is selected based on intended parameters of the error correction decoding scheme 235. In some embodiments, the intended parameters are the number of states in the trellis structure 410. In some embodiments, the intended parameters are the size of the repetition code described in the repetition code instructions 820.

Further, method 900 includes identifying a repetition code for the second portion (Act 910). In some embodiments, this act creates or identifies a repetition code based on the size of the second portion, in bits or symbols, and the size of groups of the first portion with a corresponding constant second portion.

The method 900 includes decoding the first portion of the received data packets using a trellis decoder on the trellis structure (Act 912). Act 912 is similar to act 606 or act 706, except that it is performed only for the data of first portion of the data packets.

Once the first portion is decoded in act 912, method 900 includes mapping the decoded first portion to the corresponding second portion using the created mapping (Act 914). In some embodiments, this is identifying the groups of the first portion for which the second portion is constant. This allows the repetition decoder to identify the groups of packets over which to apply the repetition code.

In some embodiments, the decoding of the first and second portions is interrelated. For example, the first portion may contain a first sequence and the second portion may contain a second sequence and the two sequence are related. In some embodiments, the first and second sequences are related such that they form a third sequence. In some embodiments, the first and second sequences are interrelated such that the first sequence must be decoded in order to decode the second sequence. In some embodiments, there are three or more portions which are interrelated. In some embodiments, these three or more portions all contain the same kind of interrelationship. In some embodiments, they contain different kinds of interrelationships.

The method 900 also includes decoding the mapped corresponding second portion values using the repetition code (Act 916). Since each bit or symbol in the second portion should be the same for every group with a constant second portion value, each bit can be individually decoded using the repetition decoder. For example, if the second portion is two bits or symbols and a group of constant second portion value is ten packets, the repetition decoder would decode the ten first bit or symbol values together. It would also decode the ten second bit or symbol values together. The result would be decoded values for the first and second bit or symbol of the two bits or symbols in the second portion for the group of constant second portion value.

Having decoded both the first and second portions, method 900 includes combining decoded first and second portions into decoded data packets (Act 918). In some embodiments, the decoded data packets are decoded data packets 231. In some embodiments, the decoded data packets are decoded values for the data in the data packets forming a relationship between the data packets 101.

It should be noted that acts 904, 906, 908, 910, and 914 generally correspond to act 304 of method 300. Likewise, acts 912, 916, and 918 generally correspond to act 306 of method 300. In this way, some embodiments of method 900 are analogous or similar to method 300.

Figure 10A:
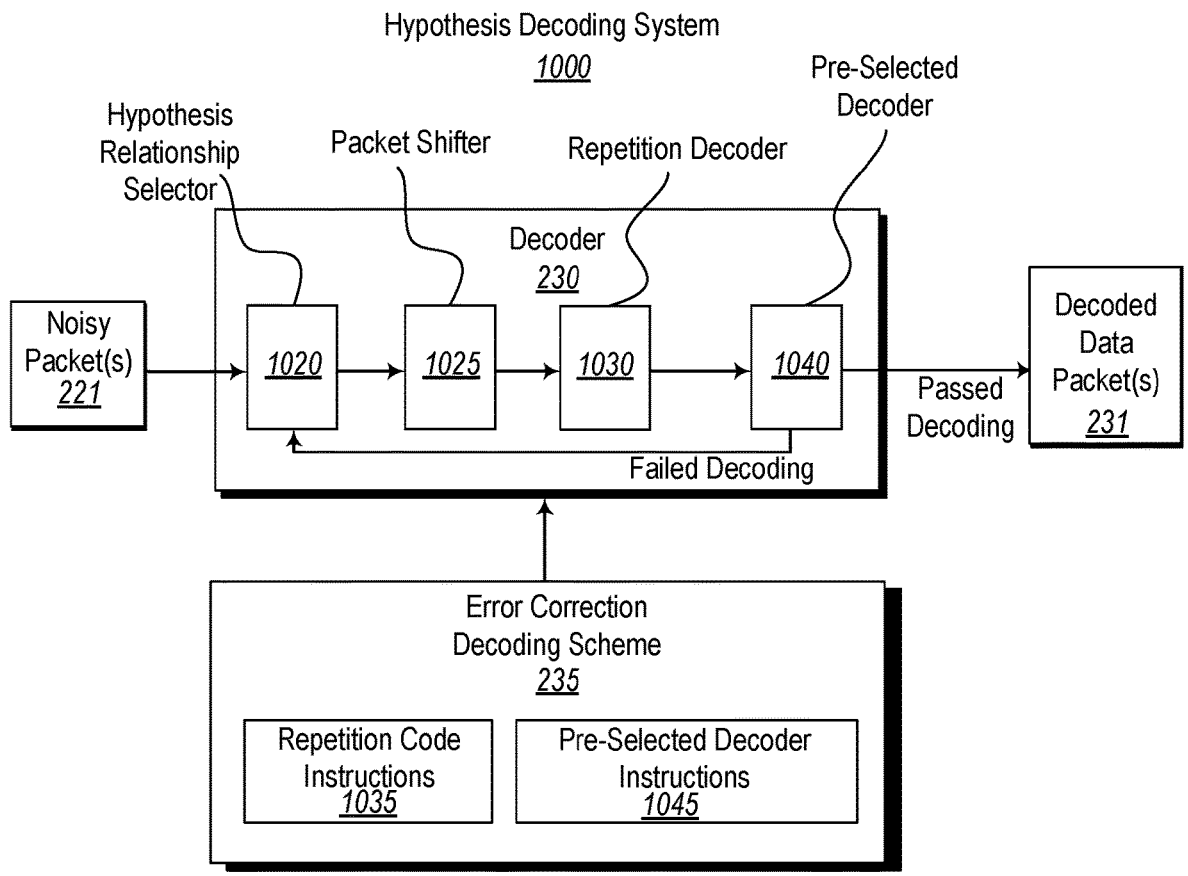
FIG. 10a illustrates a system embodiment for practicing hypothesis decoding.

FIG. 10a illustrates a hypothesis decoding system 1000. A hypothesis decoding system 1000 is yet another embodiment of a system for implementing the method described in method 300.

Hypothesis decoding system 1000 includes a decoder 230 and an error correction decoding scheme 235. Decoder 230 includes a hypothesis relationship selector 1020, a packet shifter 1025, a repetition decoder 1030, and a pre-selected decoder 1040. Error correction decoding scheme 235 includes a repetition code instructions 1035 and pre-selected decoder instructions 1045.

In hypothesis decoding system 1000, noisy packets 221 are received by decoder 230. The decoder 230 passes the noisy packets from the hypothesis relationship selector 1020 to the packet shifter 1025, to the repetition decoder 1030, and finally to the pre-selected decoder 1040. The pre-selected decoder 1040 either passes decoding and outputs decoded data packets 231 or fails decoding and sends the noisy packets 221 back to the hypothesis relationship selector 1020.

Hypothesis relationship selector 1020 selects a hypothesis relationship and assigns hypothesis values to the noisy data packets 221. For example, the hypothesis relationship may be that every noisy data packet is a value in a sequence beginning at the first packet. Another example is that every noisy data packet may have a portion that is the same value. The values corresponding to these samples are the hypothesis values assigned to the noisy data packets 221.

Packet shifter 1025 shifts bit or symbol values in the noisy packets 221 based on the hypothesis values assigned. Repetition decoder 1040 uses repetition code instructions 1035 to decode the shifted packets from the packet shifter. Pre-selected decoder 1040 uses pre-selected decoder instructions 1045 to decode the output of the repetition decoder 1030.

In some embodiments, the pre-selected decoder is a soft-decision decoder. In some embodiments, the pre-selected decoder is the matching decoder for the error correction code used to encode the messages in the data packets 101.

Figure 10B:
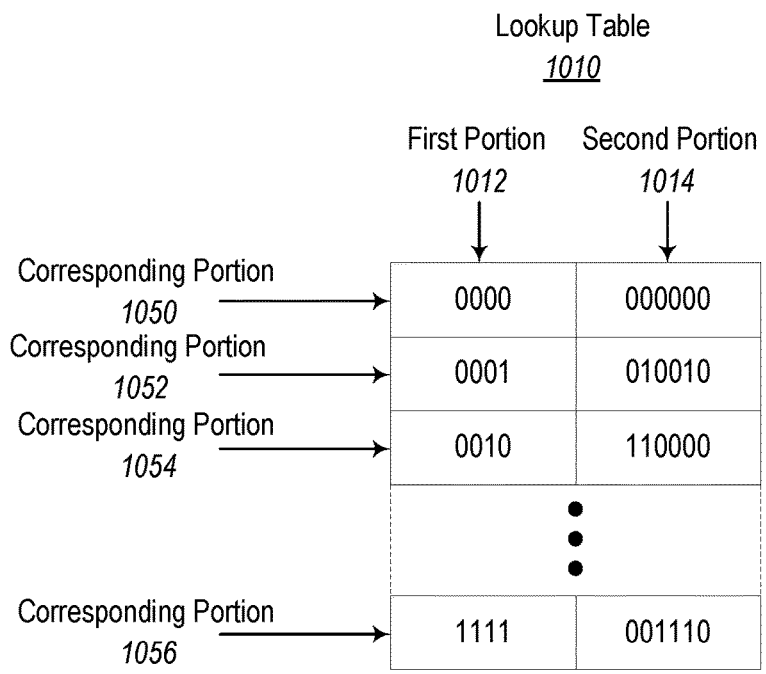
FIG. 10b illustrates an embodiment of a lookup table for a hypothesis decoding system.

FIG. 10b illustrates packet shifting reference values 1010 for hypothesis decoding system 1000. The values include two parts, a first portion 1012 and a second portion 1014. In each portion, there are corresponding portions 1050, 1052, 1054, and 1056. The values depicted in FIG. 10b are only for example. In some embodiments, first portion 1012 corresponds to a message portion of encoded packets 211. In some embodiments, second portion 1014 is parity portion of encoded packets 211 matching a message portion contained in first portion 1012. In some embodiments, these message and parity portions are defined by or can be determined from an error correction code used to encode the message portion of data packets 101 into encoded packets 211. In some embodiments, the error correction code used to encode the message portion of data packets 101 into encoded packets 211 is part of error correction encoding scheme 215.

In some embodiments, the hypothesis decoding system 1000 and the data packets 101 are encoded using systematic linear encoders. In linear codes, the linear nature of the codewords allows the principle of superposition to be exploited. In this context, it is used to identify that flipping a bit or symbol in the data packet 101 prior to encoding by the encoder 210 flips the same bits or symbols in the parity portion of the codewords, regardless of the value of the other bits or symbols in the data packet 101. As such, a bit or symbol in a first or message portion of a codeword in a received noisy data packet 221 can be incremented by flipping the appropriate bit or symbol and, due to the linear nature of the code, there is a known set of bits or symbols in a second or parity portion that can correspondingly be flipped to increment the entire codeword in the noisy data packet 221.

In some embodiments, the relationship between the first portion 1012 and the second portion 1014 is kept track of in a lookup table. In some embodiments, it is calculated dynamically. For example, as shown in FIG. 10b, corresponding portion 1050 includes bits (0 0 0 0) in first portion 1012 and the corresponding value in second portion 1014 is bits (0 0 0 0 0 0). Corresponding portion 1052 includes bits (0 0 0 1) in first portion 1012 and the corresponding value in second portion 1014 is bits (0 1 0 0 1 0). Assuming that the desired reference value is corresponding portion 1050, to shift corresponding portion 1052 to this reference value, there must be one flip of the fourth bit in first portion 1012 of corresponding portion 1052 and flips of the second and fifth bits in the second portion 1014 of corresponding portion 1052.

Similarly, corresponding portion 1056 would require flips of all four bits of first portion 1012 and flips of the third, fourth, and fifth bits of second portion 1014. This could also be performed by finding the individual bit flips for each non-zero bit of the corresponding portion. For example, using the bit flips necessary for corresponding portions 1052 and 1054, corresponding portion 1056 would be shifted to match the first portion 1012 containing bits (1 1 0 0) (not shown) and the corresponding second portion 1014 (not shown).

Thus, in some embodiments, for a sequence of messages, the parity portions for each possible message are not only known from the encoder used, but also the codeword for each message can be shifted to the codeword of any other message in a known manner. Shifting all the noisy packets 221 to a chosen reference value creates a sequence of shifted noisy packets all at the reference value. These can be decoded using a repetition code, such as that for repetition decoder 1030.

Similar to trellis decoding system 400 and hybrid decoding system 800, in some embodiments, hypothesis decoding system 1000 is agnostic to the error correction encoding system 235 used on the data packets. In some embodiments, the code length and/or code rate for the encoder must also be known. Further, the relationship between the parity bits and the messages in the error correction encoding system 215 must also be known. However, in some embodiments, the decoder for the error correction code used in the error correction encoding scheme 235 need not be known or used. Within the requirements listed herein, the encoder can be changed at will without impacting hypothesis deciding system 1000. This advantageously allows for changes to the encoder 210 and/or the error correction encoding scheme 215 without affecting the decoder 230 and the error correction decoding scheme 235.

In embodiments where the matching decoder is used as the pre-selected decoder, the hypothesis decoding system 1000 is only agnostic to the error correction encoding system in the sense that it provides the additional repetition decoding prior to the pre-selected decoding. In this sense, in some embodiments, the hypothesis decoding system improves the forward error correction of the overall system without changing the error correction encoding scheme 215.

Further, in systems or embodiments where the data packet size is small, some embodiments of hypothesis decoding system 1000 advantageously provide superior forward error correction over the error correction encoding scheme 215. In some embodiments, superior forward error correction is that hypothesis decoding system 1000 has a smaller bit-error rate or requires a lower SNR than error correction coding scheme 215.

Figure 11:
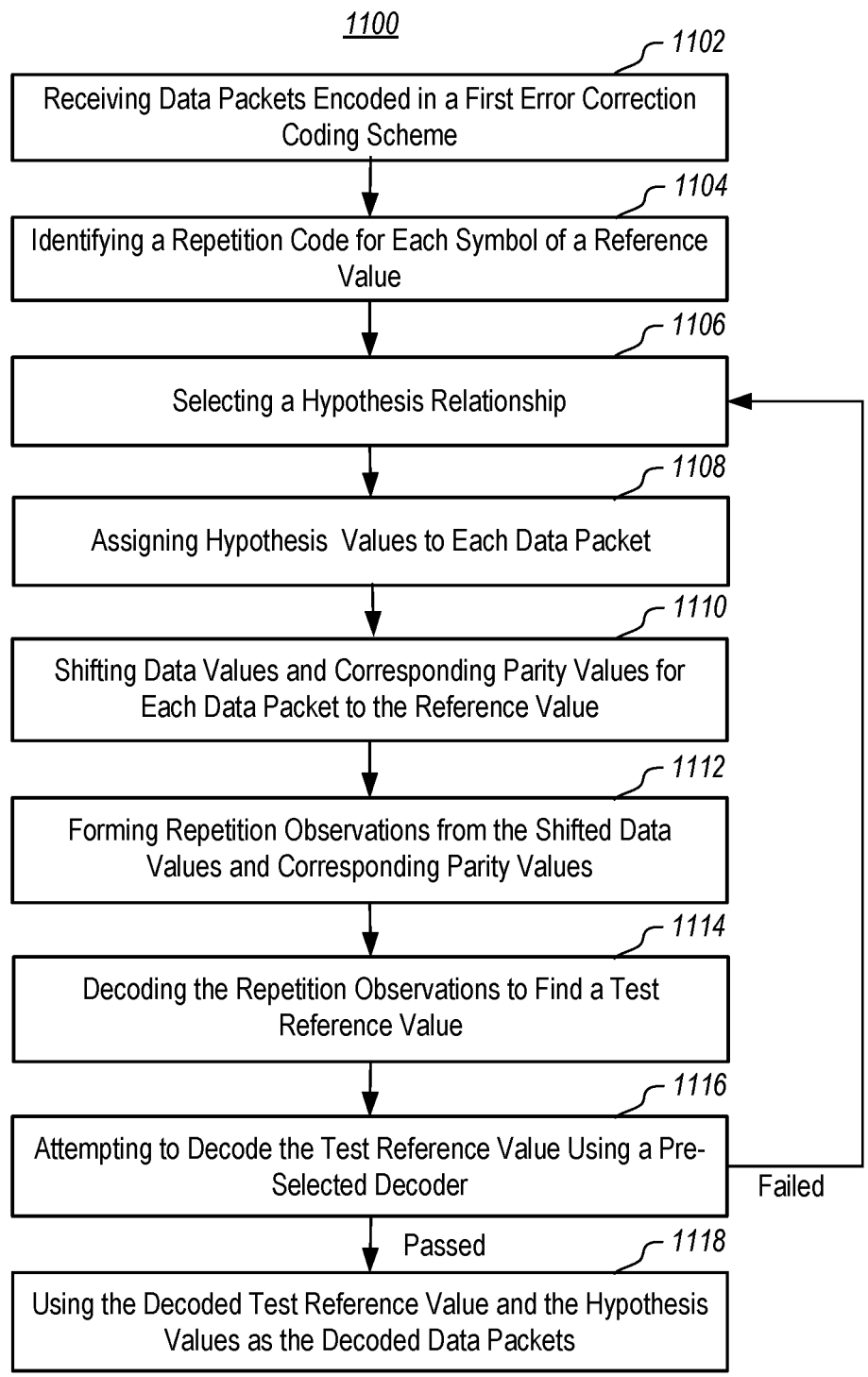
FIG. 11 illustrates a method for providing forward error correction of data packets using a hypothesis test.

FIG. 11 illustrates a method 1100 for performing decoding of data packets. The method 1100 is still another embodiment similar to method 300 and is an embodiment of methods for using or decoding with hypothesis decoding system 1000.

Method 1100 includes receiving data packets encoded in a first error correction coding scheme (Act 1102). Act 1102 is the analogous to Act 302 in method 300.

The method 1100 further includes identifying a repetition code for each symbol of a reference value (Act 1104). In some embodiments, a reference value is chosen and a repetition code is identified for each bit of the reference value. In some embodiments, the reference value includes message and parity portions of the data packet. In some embodiments, the symbols are bits. In some embodiments, this step is performed once for the error correction coding scheme 235. In some embodiments, the reference value is an all zeros message and corresponding parity bits. In some embodiments, the reference value is a codeword from the first error correction encoding scheme.

Method 1100 includes selecting a hypothesis relationship (Act 1106). In hypothesis decoding system 1000, act 1106 is performed by hypothesis relationship selector 1020. The selected hypothesis relationship is a hypothesis, or guess, at the true relationship present in the data packets. In some embodiments, the hypothesis relationship is selected from a known list or group of possible hypotheses. For example, in some embodiments, the relationships may include a sequence of values. The hypothesis relationship can be selected as this sequence with one of the data packets being chosen as the starting point for the sequence of values. In some embodiments, there may be different sequences that may be chosen from. In some embodiments, all the values in the sequence are the same. In some embodiments, the sequence providing the relationship between data in the data packets 101 is finite in length and repeats. In some embodiments, additional processing or analysis is performed to improve or otherwise make an educated or informed guess at the starting point. In some embodiments, the first packet is selected as the starting point. In some embodiments, the starting point is not the reference value.

Method 1100 further includes assigning hypothesis sequence values to each data packet (Act 1108). The hypothesis relationship selected in act 1106 defines the values that the packets or portions of packets take on.

As an example, if there are ten data packets 101 and the hypothesis relationship is a sequence of length five, if the first data packet is chosen as the hypothesis for the starting point of the sequence, data packets two through five are the next four values in the sequence. Data packet six repeats the starting point value and the sequence repeats in packets seven through ten. If the third packet were chosen as the hypothesis for the starting point of the sequence, packets four through seven would be the next four values in the sequence, packet eight would repeat the starting value and packets nine and ten would be the second and third sequence values. Packets one and two would be the fourth and fifth values, respectively.

Method 1100 includes shifting hypothesis values and corresponding parity values for each data packet to the reference value (Act 1110). In hypothesis decoding system 1000, act 1110 is performed by packet shifter 1025. The packet shifter 1025 shifts the bit or symbol values for each noisy packet 221 by flipping bits until each noisy packet 221 has been shifted to the reference value.

This leads directly to forming repetition observations from the shifted hypothesis values and corresponding parity values (Act 1112). The flipped message and parity portions form observations of the noisy reference value.

Method 1100 includes decoding the repetition observations to find a test reference value (Act 1114). This test reference value is an observation of the reference value based on the received noisy data packets. Depending on the amount of noise, distortion, or other effects in the channel 220, the test reference value may not match the true reference value. In some embodiments, using the repetition decoder on the shifted noisy data packets, as in act 1114, provides an improvement in the error correction capability of the hypothesis decoding system 1000. In some embodiments, this is accomplished by averaging the noise over the packets through the repetition code. In some embodiments, the repetition decoder is a soft-decision repetition decoder.

Because of this, the method 1100 includes attempting to decode the test reference value using a pre-selected decoder (Act 1116). In hypothesis decoding system 1000, the pre-selected decoding is performed by the pre-selected decoder 1040. The pre-selected decoder uses the relationship between the message and parity portions of the chosen reference value to decode the test reference value.

In some embodiments, the pre-selected decoder is a decoder that provides an indication of whether decoding was successful. In some embodiments, the pre-selected decoder is a modified decoder that has been modified to provide an indication of whether decoding was successful. In some embodiments, a matched filter is used to verify that the decoding is successful. The matched filter compares the output of the pre-selected decoder with the hypothesis value to see if the decoding matched the hypothesis. In some embodiments, if the output of the matched filter is larger than some threshold, the matched filter indicates that the decoding was successful. In some embodiments, checking the output of the pre-selected decoder is performed by using both the matched filter and the indication from the decoder. In some embodiments, if the decoder indicator and the matched filter do not both indicate successful decoding, the pre-selected decoder performs decoding again.

When act 1116 indicates that decoding failed, method 1100 returns to Act 1106 and repeats until decoding is successful. Act 1116 indicates that decoding was successful, method 1100 continues to act 1118.

Method 1100 includes using the decoded test reference value and the hypothesis sequence values as the decoded data packets (Act 1118). In some embodiments, successfully decoding the test reference value indicates that the hypothesis or starting point was chosen correctly. As such, the hypothesis sequence values assigned in act 1108 are correct and are the values of the decoded data packets 231.

It should be noted that act 1104 generally corresponds to act 304 of method 300. Likewise, acts 1106-1118 generally correspond to act 306 of method 300. In this way, method 1100 is analogous or similar to method 300.

In the various embodiments disclosed herein, the contents of data packets are referred to as bits or symbols. Those skilled in the art will understand the various choices of symbol values in a data packet or error correction code, including bits, finite-field symbols, real numbers, and binary finite-field symbols, as well as the advantages, motivations, and required modifications for using them. The use of the words symbols or bits in this specification should be understood to allow for variation of choice in the symbol values used for the data or error correction codes as required by individual system embodiments.

In the various embodiments disclosed herein, error correction decoders are used. As expressed in the trellis decoding system 400, the hybrid decoding system 800, and the hypothesis decoding system 1000, in some embodiments, there is error correction decoding hardware (implemented as either a hardware solution or programmatically configured hardware) provided in the form of decoder 230 and an error correction decoding scheme 235 providing instructions for that hardware. In some embodiments, the decoders are entirely hardware based. In such embodiments, decoder 230 includes hardware that implements the error correction decoding scheme 235 and any associated instructions.

For example, in some embodiments, decoder 230 in hypothesis decoding system 1000 includes hardware for pre-selected decoder 1040. In some embodiments, pre-selected decoder instructions 1045 are run or executed by that hardware. In other embodiments, the hardware is a field-programmable gate array (FPGA), logic gates, or other hardware implementation that implements the decoder and incorporates the instructions in its design.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for providing forward error correction for at least a portion of each of a plurality of data packets, the at least a portion of each of the plurality of data packets comprising a relationship between data, across packets, in each of the plurality of data packets, the method comprising:
- receiving the plurality of data packets, the plurality of data packets being encoded in a first error correction coding scheme;
- identifying a second error correction coding scheme based on the relationship, the relationship being a non-random, predictable relationship, providing additional information about contents of the data packets, between the data, across packets, in each of the plurality of data packets; and
- performing error correction on noisy packets by decoding the at least a portion of each of the plurality of data packets using the second error correction coding scheme, using the additional information about contents of the data packets.

2. The method of claim 1, wherein the relationship between the data in each of the plurality of data packets is a sequence across each of the plurality of data packets.

3. The method of claim 2 wherein the sequence includes a packet number.

4. The method of claim 1, wherein:
- identifying the second error correction coding scheme comprises identifying a trellis structure based on the relationship between the data in each of the plurality of data packets contained in the at least a portion of each of the plurality of data packets; and
- decoding using the second error correction coding scheme comprises using a trellis decoder on the trellis structure to decode the at least a portion of each of the plurality of data packets.

5. The method of claim 4, wherein the trellis decoder is a hard-decision Viterbi decoder and uses symbol values of the at least a portion of each of the plurality of data packets.

6. The method of claim 4, wherein the trellis decoder is a soft-decision Viterbi decoder and uses probabilities of symbol values of the at least a portion of each of the plurality of data packets.

7. The method of claim 4, wherein:
- the at least a portion of each of the plurality of data packets further comprises a first portion and a second portion, the first portion including the relationship between each of the plurality of data packets;
- wherein the trellis structure is based on the first portion, without respect to the second portion; and
- wherein using the trellis decoder comprises decoding the first portion.

8. The method of claim 7, wherein the trellis decoder is a hard-decision Viterbi decoder and uses symbol values of the first portion.

9. The method of claim 7, wherein the trellis decoder is a soft-decision Viterbi decoder and uses probabilities of symbol values of the first portion.

10. The method of claim 1, wherein:
- identifying the second error correction coding scheme comprises:
  - splitting the at least a portion of each of the plurality of data packets into a first portion and a second portion, wherein decoded values of the first portion each have corresponding values in the second portion,
  - identifying a trellis structure based on the decoded values of the first portion,
  - accessing a mapping from decoded values of the first portion to the corresponding values of the second portion, and
  - identifying a repetition code for the second portion based on the mapping; and
- decoding using the second error correction coding scheme comprises:
  - using a trellis decoder on the trellis structure to decode the first portion into a decoded first portion,
  - using the mapping to map the decoded values of the first portion to the corresponding values for the second portion,
  - decoding the second portion using the repetition code on mapped corresponding values for the second portion to find a decoded second portion, and
  - combining the decoded first portion and the decoded second portion.

11. The method of claim 10, wherein the trellis decoder is a hard-decision Viterbi decoder and uses symbol values of the first portion.

12. The method of claim 10, wherein the trellis decoder is a soft-decision Viterbi decoder and uses probabilities of symbol values of the first portion.

13. The method of claim 10, wherein the repetition code is decoded using symbol values of the second portion.

14. The method of claim 10, wherein the repetition code is decoded using probabilities of symbol values of the second portion.

15. The method of claim 10 wherein:
- the first portion comprises a plurality of first bits, the plurality of first bits comprising one or more groups of first bits which represent one or more first symbols taken from a finite field; and
- the second portion comprises a plurality of second bits, the plurality of second bits comprising one or more groups of second bits which represent one or more second symbols taken from the finite field.

16. The method of claim 1, wherein:
- the at least a portion of each of the plurality of data packets further comprises:
  - a first portion comprising at least a portion of the relationship between data in each of the data packets, and
  - a second portion comprising a corresponding parity value determined from encoding the first portion using the first error correction encoding scheme;
- identifying the second error correction coding scheme comprises identifying a repetition code for a reference value; and
- decoding using the second error correction coding scheme comprises:
  - a hypothesis decoding method comprising:
    - selecting a hypothesis relationship for the relationship between the data in each of the data packets,
    - assigning each data packet in the plurality of data packets a hypothesis value based the hypothesis relationship,
    - shifting the first and second portion for each data packet based on the difference between the reference value and the hypothesis value assigned to that data packet, the shifting creating a shifted first and second portion for each data packet,
    - forming a plurality of repetition codewords from the shifted first and second portion for each data packet, each repetition codeword comprising each symbol in each shifted first and second portion,
    - decoding the plurality of repetition codewords to find a test reference value,
    - attempting to decode the test reference value using a decoder to find a decoded reference value; and using the hypothesis decoding method until attempting to decode the test reference value using the decoder succeeds, each attempt using a different hypothesis relationship;

using the decoded reference value from a successful attempt to decode the test reference value; and using the hypothesis value for each other data packet.

17. The method of claim 16, wherein the first error correction encoding scheme encoding the at least a portion of each of the plurality of data packets encodes the at least a portion of each of the plurality of data packets using one or more systematic linear encoders.

18. The method of claim 16, wherein each symbol is a finite-field symbol.

19. The method of claim 16, wherein the finite-field symbol is taken from a binary finite field.

20. A method for providing forward error correction for at least a portion of each of a plurality of data packets, the at least a portion of each of the plurality of data packets comprising a relationship between data, across packets, in each of the plurality of data packets, the method comprising:

receiving the plurality of data packets, the plurality of data packets being encoded in a first error correction coding scheme;

identifying a trellis structure based on the relationship, the relationship being a non-random, predictable relationship, including additional information about contents of the data packets provided by the relationship, between data, across packets, in each of the plurality of data packets contained in the at least a portion of each of the plurality of data packets; and performing error correction of noisy packets by decoding using a trellis decoder on the trellis structure to decode the at least a portion of each of the plurality of data packets.

21. The method of claim 20, wherein the trellis decoder is a hard-decision Viterbi decoder and uses symbol values of the at least a portion of each of the plurality of data packets.

22. The method of claim 20, wherein the trellis decoder is a soft-decision Viterbi decoder and uses probabilities of symbol values of the at least a portion of each of the plurality of data packets.

23. A method for providing forward error correction for at least a portion of each of a plurality of data packets, data in the at least a portion of each of the plurality of data packets comprising a relationship between data in the plurality of data packets, the method comprising:

receiving the plurality of data packets, the plurality of data packets being encoded in a first error correction coding scheme, the at least a portion of each of the plurality of data packets including:

a first portion including at least a portion of the relationship between data in each of the data packets, and a second portion including a corresponding parity value determined from encoding the first portion using the first error correction coding scheme;

identifying a repetition code for each symbol of a reference value; and decoding using a second error correction coding scheme, the second error correction coding scheme comprising:

a hypothesis decoding method comprising:

selecting a hypothesis relationship for the relationship between the data in each of the plurality of data packets, assigning each data packet in the plurality of data packets a hypothesis value from the hypothesis sequence, shifting the first and second portion for each data packet based on the difference between the reference value and the hypothesis value assigned to that data packet, the shifting creating a shifted first and second portion for each data packet, forming a plurality of repetition codewords from the shifted first and second portion for each data packet, each repetition codeword comprising each symbol in each shifted first and second portion in a single position, decoding the plurality of repetition codewords to find a test reference value, attempting to decode the test reference value using a pre-selected decoder to find a decoded reference value; and using the hypothesis decoding method until attempting to decode the test reference value using the pre-selected decoder succeeds, each attempt using a different hypothesis relationship, using the decoded reference value from a successful attempt to decode the test reference value; and using the hypothesis value for each other data packet.

24. The method of claim 23, wherein the first error correction encoding scheme encoding the at least a portion of each of the plurality of data packets encodes the at least a portion of each of the plurality of data packets using one or more systematic linear encoders.

25. The method of claim 23, wherein each symbol is a finite-field symbol.

26. The method of claim 25, wherein the finite-field symbol is taken from a binary finite field.

* * * * *